United States Patent
Inumiya et al.

(10) Patent No.: US 7,091,135 B2
(45) Date of Patent: Aug. 15, 2006

(54) METHOD OF MANUFACTURING SEMICONDUCTOR DEVICE

(75) Inventors: Seiji Inumiya, Yokohama (JP); Kazuhiro Eguchi, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 10/798,337

(22) Filed: Mar. 12, 2004

(65) Prior Publication Data

US 2004/0235254 A1 Nov. 25, 2004

(30) Foreign Application Priority Data

Mar. 13, 2003 (JP) ............... 2003-067621

(51) Int. Cl.
*H01L 21/31* (2006.01)

(52) U.S. Cl. ............... 438/758; 438/765; 438/770; 438/775

(58) Field of Classification Search .......... 438/765, 438/766, 769, 770, 775, 783, 785, 787, 791, 438/758
See application file for complete search history.

(56) References Cited

U.S. PATENT DOCUMENTS

| 6,020,243 | A | 2/2000 | Wallace et al. | |
|---|---|---|---|---|
| 6,294,481 | B1 * | 9/2001 | Inumiya et al. | 438/766 |
| 2005/0006674 | A1 * | 1/2005 | Eguchi et al. | 257/288 |

FOREIGN PATENT DOCUMENTS

JP 2000-49349 2/2000

OTHER PUBLICATIONS

S. Inumiya, et al. "Method of Manufacturing Semiconductor Device", U.S. Appl. No. 10/101,913, filed Mar. 21, 2002.

* cited by examiner

*Primary Examiner*—Kevin M. Picardat
(74) *Attorney, Agent, or Firm*—Finnegan, Henderson, Farabow, Garrett & Dunner, L.L.P.

(57) ABSTRACT

There is disclosed a method of manufacturing a semiconductor device, which comprises forming a film containing metal elements and silicon elements on a semiconductor substrate, exposing the semiconductor substrate to an atmosphere containing an oxidant to form a silicon dioxide film at the interface between the semiconductor substrate and the film containing metal elements and silicon elements, and nitriding the film containing metal elements and silicon elements after forming the silicon dioxide film.

17 Claims, 4 Drawing Sheets

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2003-067621, filed Mar. 13, 2003, the entire contents of which are incorporated herein by reference.

BACKGROUND OF THE INVENTION

1. Field of the Invention

The present invention relates to a method of manufacturing a semiconductor device, and more particularly to a method of manufacturing a semiconductor device in which a gate insulating film of a high dielectric constant material is used in a MOSFET.

2. Description of the Related Art

FIG. 16 is a schematic perspective view of nMOSFET formed on a semiconductor substrate. As shown in FIG. 16, n-type source/drain regions 101 and 102 are formed in a p-type silicon semiconductor substrate 100. A gate insulating film 103 and a gate electrode 104 are sequentially formed on the silicon semiconductor substrate 100 in such a manner that the gate insulating film 103 and the gate electrode 104 are located between the n-type source/drain regions 101 and 102. Usually, polycrystalline Si, polycrystalline SiGe, metal or the like is used as a gate electrode material.

As the MOSFET is miniaturized, the gate insulating film is required to be more reduced in thickness. As the gate insulating film, hitherto, a silicon dioxide film or silicon oxynitride film has been used. However, since the direct tunneling current increases due to the reduction of the film thickness, the limit of the film thickness reduction is about 2 nm in the silicon dioxide film and silicon oxynitride film. In the circumstances, it has been proposed to apply a metal silicate film to the gate insulating film. Since the metal silicate film is higher in dielectric constant than the silicon dioxide film and in crystallization temperature than a metal oxide film, it matches with the conventional MOSFET process using poly-Si or poly-SiGe gate electrodes. Further, to suppress boron peratration from the gate electrode, it has been also proposed to apply a nitrided metal silicate film to the gate insulating film (Jpn. Pat. Appln. KOKAI Publication No. 2000-49349, column 10, and FIG. 8). However, satisfactory interface characteristic is not obtained. Metal nitride is conductive, and thus it is high in leakage current and in electric charge trap density. Further, a metal silicide film is formed between the metal silicate film and the gate electrode to degrade the insulation therebetween.

In a process of forming a gate insulating film made of nitrided metal silicate, for example, Hf(Zr)SiON, when a Hf(Zr)SiO film is nitrided by using nitrogen plasma, a surface of a silicon semiconductor substrate is also nitrided, so that the interface state density is increased and thus the mobility of electric carriers is lowered. To prevent the nitridation of the silicon substrate surface, it has been proposed to form a silicon dioxide film layer or silicon oxynitride film layer on the silicon substrate surface before depositing the Hf(Zr)SiO film. However, in this case, a fixed charge is generated at the interface between the silicon dioxide film layer or silicon oxynitride film layer and the Hf(Zr)SiO film, so that the mobility of carriers is not improved.

When, as is conventional, the gate insulating film is formed of the silicon dioxide film or silicon oxynitride film, the film thickness reduction of the gate insulating film associated with the miniaturization trend of a MOSFET is close to its physical limit, and it is nowadays considered inevitable to use a high dielectric constant material gate insulating film having a higher dielectric constant than the silicon dioxide film or silicon oxynitride film. It is, however, a problem of such a high dielectric constant material is that the thermal stability is poor, and it has been proposed to introduce nitrogen to improve the thermal stability. To this end, it is typical to make the high dielectric constant material into the nitride by using plasma or $NH_3$. However, in the method of introducing nitrogen, the surface of the silicon semiconductor substrate is also nitrided, so that the interface state is increased, and the mobility of carriers deteriorates. To prevent nitridation of the silicon semiconductor substrate, it is advantageous to provide a silicon dioxide film or acid nitride film of 1 nm or less between the high dielectric constant material and the silicon substrate, however, this generates fixed charges at the interface between this interfacial layer and the high dielectric constant material, and the mobility of carriers is not improved.

BRIEF SUMMARY OF THE INVENTION

According to an aspect of the present invention, there is provided a method of manufacturing a semiconductor device, comprising:

forming a film containing metal elements and silicon elements on a semiconductor substrate;

exposing the semiconductor substrate to an atmosphere containing an oxidant to form a silicon dioxide film at the interface between the semiconductor substrate and the film containing metal elements and silicon elements; and nitriding the film containing metal elements and silicon elements after forming the silicon dioxide film.

According to another aspect of the present invention, there is provided a method of manufacturing a semiconductor device, comprising:

forming a film containing metal elements and silicon elements on a semiconductor substrate;

exposing the semiconductor substrate to an atmosphere containing an oxidant to form a silicon dioxide film at the interface between the semiconductor substrate and the film containing metal elements and silicon elements;

nitriding the film containing metal elements and silicon elements to form a gate insulating film comprising the silicon dioxide film and a nitrided film containing metal elements and silicon elements;

forming a gate electrode on the gate insulating film; and forming source/drain regions in the surface region of the semiconductor substrate to sandwich a region covered by the gate electrode.

DETAILED DESCRIPTION OF THE INVENTION

Embodiments of the present invention will be described hereinafter, by referring to the accompanying drawings.

In each of the embodiments, a high dielectric constant material containing metal elements and silicon elements is formed by a deposition method on a surface of a silicon semiconductor substrate. Then, the interface between the high dielectric constant material film and silicon semiconductor substrate is oxidized via the high dielectric constant material film. Subsequently, the high dielectric constant material film is nitrided. The nitrided high dielectric constant material film is used typically as a gate insulating film of a MOSFET in a semiconductor device. In a first embodiment, a method of forming the high dielectric constant material film by nitridation is disclosed, and in a second embodiment, a process of manufacturing an n-channel MOSFET in which the nitrided high dielectric constant material film is used in a gate structure composed of a gate electrode and a gate insulating film, is disclosed.

The first embodiment will be explained by referring to FIGS. 1 to 4.

FIGS. 1 to 4 are sectional views explaining the process of forming a high dielectric constant material film on a semiconductor substrate according to the first embodiment of the present invention.

Figure 1:
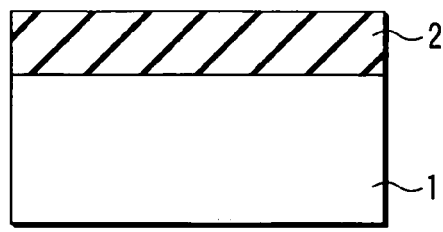
FIG. 1 is a sectional view of a semiconductor device in a manufacturing step, for explaining a method of manufacturing the semiconductor device according to a first embodiment of the present invention.

A device isolation region (not shown) such as an STI (shallow trench isolation) is formed in a silicon semiconductor substrate 1, by using a conventional method. Then, a film containing metal elements and silicon elements is formed on an exposed surface of the silicon semiconductor substrate 1. The film contains oxygen or nitrogen or, in the alternative, the film contains oxygen and nitrogen. In this embodiment, TEOS (tetra ethoxy silane) and HTB (hafnium tetra tertiary butoxide) are used as precursors of the film. As the film containing metal elements and silicon elements, a hafnium silicate film 2 of about 3 nm in thickness is formed on the exposed surface of the silicon semiconductor substrate 1, using TEOS and HTB as precursors, by MOCVD (metal organic chemical vapor deposition) method (FIG. 1).

Figure 2:
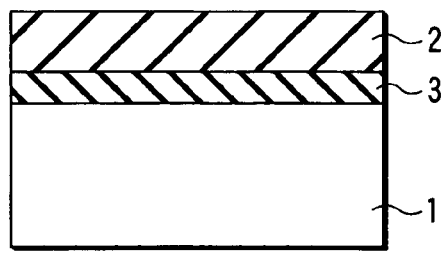
FIG. 2 is a sectional view of the semiconductor device in a manufacturing step following the manufacturing step of FIG. 1, for explaining the method of manufacturing the semiconductor device according to the first embodiment of the present invention.
Figure 3:
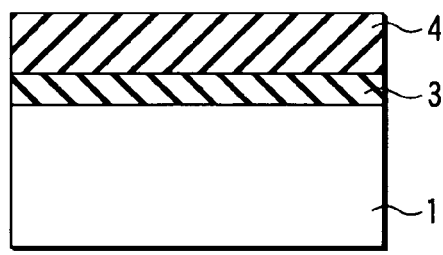
FIG. 3 is a sectional view of the semiconductor device in a manufacturing step following the manufacturing step of FIG. 2, for explaining the method of manufacturing the semiconductor device according to the first embodiment of the present invention.
Figure 4:
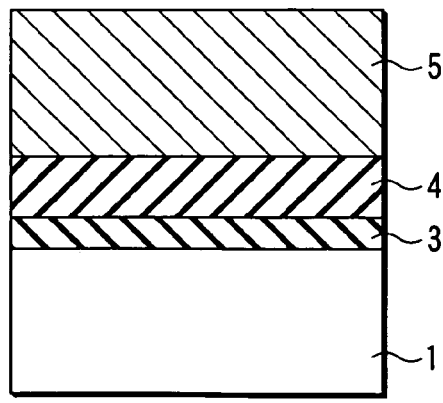
FIG. 4 is a sectional view of the semiconductor device in a manufacturing step following the manufacturing step of FIG. 3, for explaining the method of manufacturing the semiconductor device according to the first embodiment of the present invention.

The semiconductor substrate 1 is then exposed to microwave-excited plasma of a mixed gas of Ar and $O_2$ for about 40 seconds in the condition of a heater temperature of about 250° C. and pressure of about 50 mTorr to form a silicon dioxide film 3 of about 0.6 nm in thickness at the interface between the hafnium silicate film 2 and the silicon semiconductor substrate 1 (FIG. 2). Subsequently, nitrogen is introduced into the hafnium silicate film 2 to form an HfSiON film 4, using nitrogen plasma. That is, by exposing the semiconductor substrate 1 to microwave-excited plasma of a mixed gas of Ar and $N_2$ for about 360 seconds at a heater temperature of about 400° C. and a pressure of about 500 mTorr, about 20% of nitrogen is introduced into the hafnium silicate film 2, thereby to form the HfSiON film 4 (FIG. 3). Subsequently, a heating process at about 1000° C. and about 10 seconds in a low pressure oxidizing atmosphere is carried out, followed by a deposition of a polycrystalline SiGe film 5 of about 150 nm in thickness on the HfSiON film 4 (FIG. 4). The poly-SiGe film 5 is used as a gate electrode. The microwave-excited plasma is nitrogen plasma, however, nitrogen radical may be used instead of nitrogen plasma.

After that, various manufacturing steps are carried out to form the device into a MOS transistor. That is, a gate electrode patterning, an impurity ion implantation, an implanted ion activation annealing, an Ni silicide layer formation on source/drain regions, PMD (Premetal Dielectric) film depositing, a contact hole opening, a wiring forming, etc., are carried out to complete a MOS transistor.

The MOS transistor manufactured in this manner is enhanced in thermal stability due to the introduction of nitrogen. Even after the heating process at 1000° C. or more (the heating process also included in the conventional method of forming a MOS transistor), the gate leakage current is three order of magnitude lower than that of the conventional MOS transistor employing a silicon dioxide film formed directly on the semiconductor substrate as the gate insulating film. Further, the channel mobility is about 85% or more of that of the conventional MOS transistor, and there is no practical problem, and both of the low power consumption and high performance of LSI are satisfied.

In this embodiment, the Hf silicate film 2 is used as a high dielectric constant material film containing metal elements and silicon elements. However, other material films may also be used instead of the Hf silicate film 2. For example, a Zr silicate film, an Al silicate film and a La silicate film are used instead of the Hf silicate film 2, and similar advantages to those obtained by the Hf silicate film are also obtained. Also in the embodiment, alkoxides (TEOS and HTB) are used as precursors to form the silicate film 2 by using MOCVD method, however, an amide compound such as tetraxy diethyl amide hafnium or tetraxy dimethyl amide silicon may be used. When these materials are used, the deposited silicate already contains about several percent of nitrogen, and a satisfactory thermal stability is obtained by introducing less amount of nitrogen than that for the silicate film formed by using alkoxide precursors. Also in the embodiment, the silicon dioxide film 3 is formed by internal oxidation, by using low temperature plasma oxidation of active oxidation species. In this case, the silicate film 2 is free from phase separation or crystallization, and hence the formed silicon dioxide film 3 is high in quality and significantly small in thickness. Moreover, to form the silicate film 2 by using MOCVD method, an alkoxide and an amide compound may be used. For example, TEOS as the alkoxide and tetraxy dimethyl amide silicon as the amide compound may be used.

The silicon dioxide film 3 may be formed by oxygen radical oxidation, low pressure $O_2$ oxidation at about 800° C. or less, low pressure $H_2O$ oxidation at about 800° C. or less, low pressure $N_2O$ oxidation at about 800° C. or less, or the like. It is preferable that the partial pressure of an oxidant be 0.1 Torr or less to obtain the advanced thin film thickness.

Further, it is found that the nitrogen distribution in the case where high dielectric constant materials such as Hf silicate is plasma-nitrided, is wider than the nitrogen distribution in the case the silicon dioxide film is plasma-nitrided. Thus, similar advantages to those in the embodiment are obtained in a nitridation method such as a $NH_3$ nitridation method in which nitrogen is introduced widely into the film.

A second embodiment of the present invention will now be explained by referring to FIGS. 5 to 15.

This embodiment discloses a process of manufacturing nMOSFET using a gate structure composed of a gate electrode and a gate insulating film.

Figure 5:
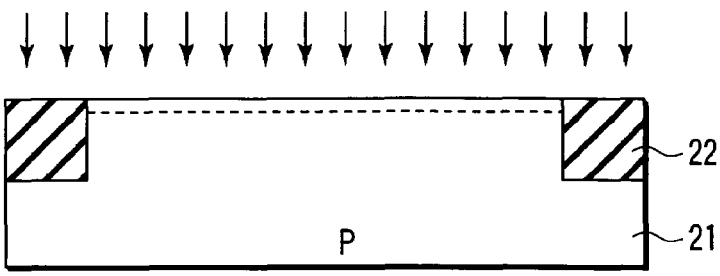
FIG. 5 is a sectional view of a semiconductor device in a manufacturing step, for explaining a method of manufacturing the semiconductor device according to a second embodiment of the present invention.

FIGS. 5 to 15 are sectional views explaining the process of manufacturing an n-channel MOSFET. First, an element separation region 22 of STI or the like is formed in a p-type silicon semiconductor substrate 21. Thereafter, boron or other ions are implanted in the exposure surface of the silicon semiconductor substrate 21 to form a channel (FIG. 5).

Subsequently, a gate insulating film 20 and a gate electrode 23 are formed sequentially on the silicon semiconductor substrate 21. The gate insulating film 20 is formed in the same process as mentioned in the first embodiment. That is, a high dielectric constant material containing metal elements and silicon elements is deposited on the surface of the silicon semiconductor substrate 21, an interfacial oxidation is carried out through the high dielectric constant material film, and the high dielectric constant material film is nitrided. In the first embodiment, the nitrided high dielectric constant material film is an HfSiON film 4, and the gate insulating film is composed of the HfSiON film 4 and the silicon dioxide film 3. The silicon dioxide film 3 is formed at the interface between the HfSiON film 4 and the semiconductor substrate 1.

Figure 6:
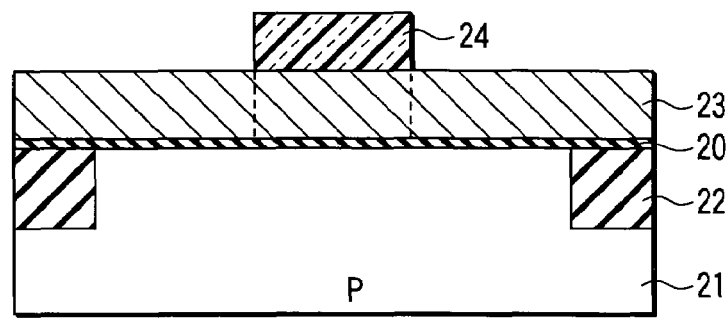
FIG. 6 is a sectional view of the semiconductor device in a manufacturing step following the manufacturing step of FIG. 5, for explaining the method of manufacturing the semiconductor device according to the second embodiment of the present invention.
Figure 7:
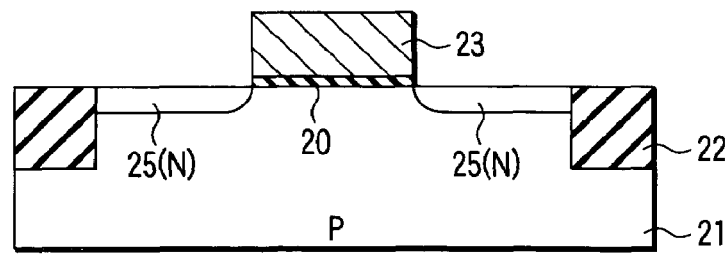
FIG. 7 is a sectional view of the semiconductor device in a manufacturing step following the manufacturing step of FIG. 6, for explaining the method of manufacturing the semiconductor device according to the second embodiment of the present invention.
Figure 8:
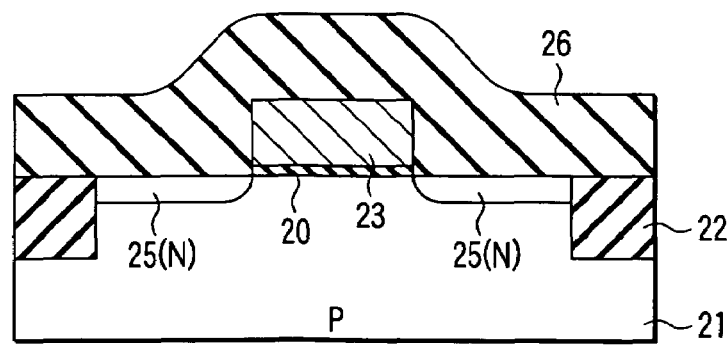
FIG. 8 is a sectional view of the semiconductor device in a manufacturing step following the manufacturing step of FIG. 7, for explaining the method of manufacturing the semiconductor device according to the second embodiment of the present invention.

In the second embodiment, the gate insulating film 20 is similar to the gate insulating film as in the first embodiment, that is, the gate insulating film 20 is composed of the HfSiON film 4 and the silicon dioxide film 3 formed at the interface between the HfSiON film 4 and the semiconductor substrate 1 as shown in FIGS. 1 to 4. The gate electrode 23 is, for example, formed of a polycrystalline silicon (poly-Si) film. The gate electrode 23 may be also a poly-SiGe film. Further, the gate electrode 23 may be a metal material film. After forming the gate electrode 23, the gate electrode 23 is coated with photo resist 24, and it is patterned in a form of a gate electrode (FIG. 6). Using the patterned photo resist 24 as a mask, the gate insulating film 20 and the gate electrode 23 formed thereon are etched, and a gate structure is formed. Thereafter, using the gate electrode 23 as a mask, arsenic ions, for example, are implanted in the surface region of the silicon semiconductor substrate 21 to form n-type source/drain contact regions 25 (FIG. 7). Subsequently, a silicon dioxide ($SiO_2$) film 26 is deposited over the entire surface of the silicon semiconductor substrate 21 by CVD method to cover the gate electrode 23 (FIG. 8).

Figure 9:
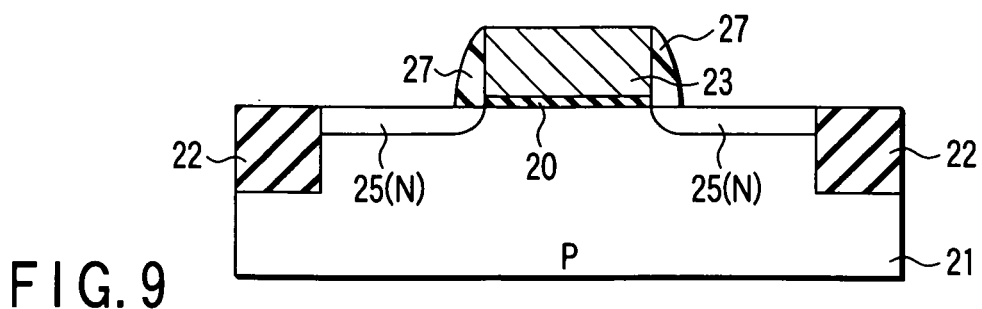
FIG. 9 is a sectional view of the semiconductor device in a manufacturing step following the manufacturing step of FIG. 8, for explaining the method of manufacturing the semiconductor device according to the second embodiment of the present invention.
Figure 10:
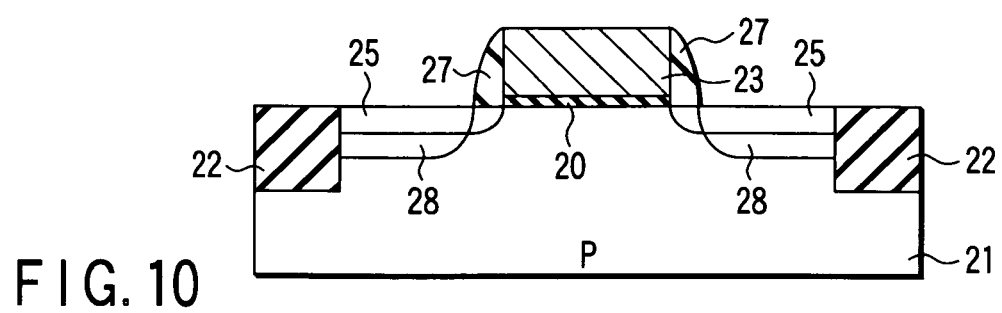
FIG. 10 is a sectional view of the semiconductor device in a manufacturing step following the manufacturing step of FIG. 9, for explaining the method of manufacturing the semiconductor device according to the second embodiment of the present invention.
Figure 11:
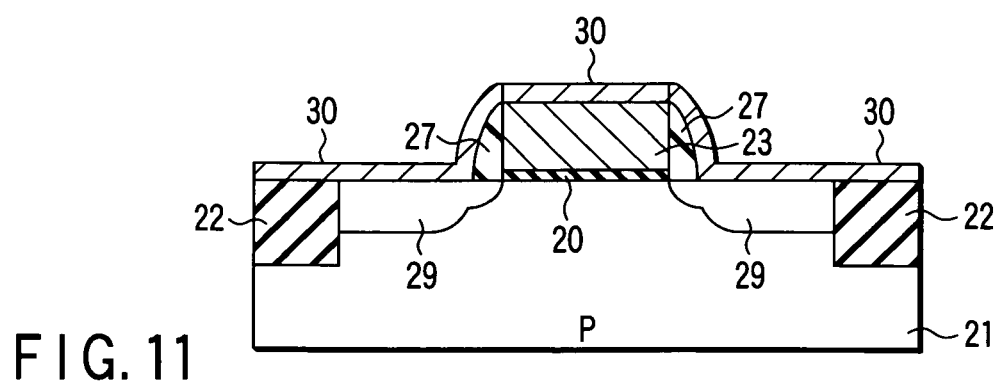
FIG. 11 is a sectional view of the semiconductor device in a manufacturing step following the manufacturing step of FIG. 10, for explaining the method of manufacturing the semiconductor device according to the second embodiment of the present invention.
Figure 12:
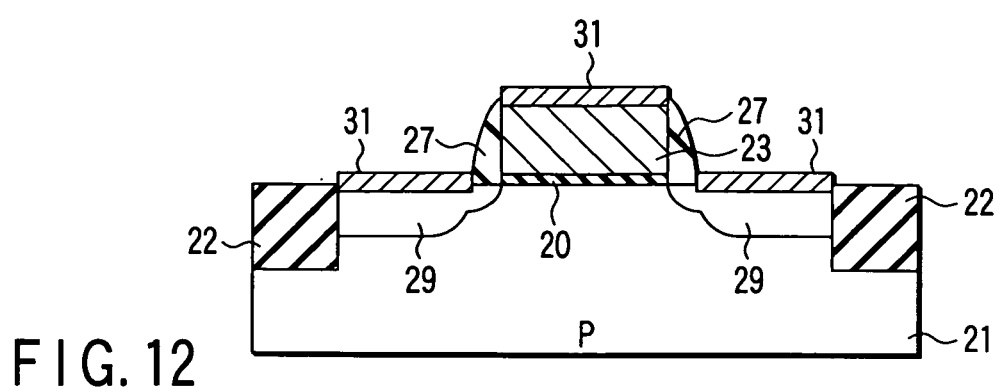
FIG. 12 is a sectional view of the semiconductor device in a manufacturing step following the manufacturing step of FIG. 11, for explaining the method of manufacturing the semiconductor device according to the second embodiment of the present invention.

Thereafter, a side wall insulating film 27 is formed on the side of the gate electrode 23 by etching back the silicon dioxide film 26 by using, for example, RIE (reactive ion etching) method (FIG. 9). Using the side wall insulating film 27 as a mask, phosphorus, arsenic or other ions are implanted on the surface region of the silicon semiconductor substrate 21 to form n-type source/drain high concentration regions 28 (FIG. 10). Then, n-type source/drain regions 29 are formed from the source/drain contact regions 25 and source/drain high concentration regions 28, by carrying out a heating process for activation for about 10 seconds at a temperature of about 1000° C. (FIG. 11). Thereafter, a metal film 30 of cobalt (Co), nickel (Ni) or the like is deposited on the entire surface of the silicon semiconductor substrate 21 by sputtering or the like. The silicon semiconductor substrate 21 is then thermally heated. By the heat treatment of the silicon semiconductor substrate 21, those portions of the metal film 30, which are deposited on the surface of the silicon semiconductor substrate 21 and the surface of the gate electrode 23, are transformed into metal silicide films 31 of $CoSi_2$, NiSi or the like. Those portions of the metal film 30, which are deposited on the side wall insulating film 27 and element separation region 22, are not changed. Thereafter, those portions of the metal film 30, which are deposited on the side wall insulating film 27 and element separation region 22, are removed by a known method (FIG. 12).

Figure 13:
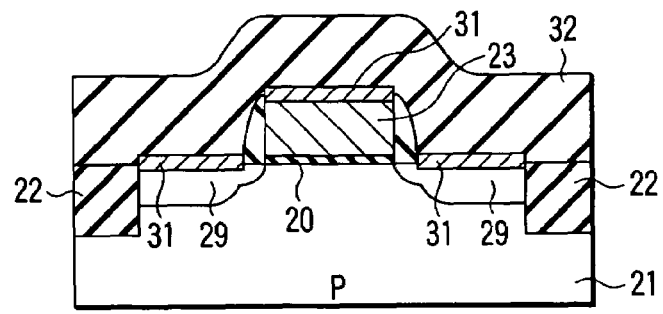
FIG. 13 is a sectional view of the semiconductor device in a manufacturing step following the manufacturing step of FIG. 12, for explaining the method of manufacturing the semiconductor device according to the second embodiment of the present invention.
Figure 14:
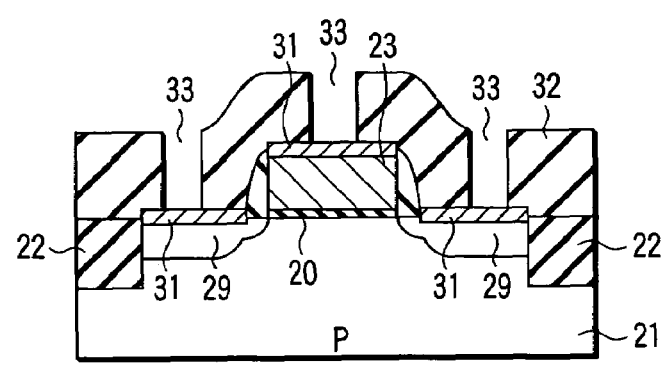
FIG. 14 is a sectional view of the semiconductor device in a manufacturing step following the manufacturing step of FIG. 13, for explaining the method of manufacturing the semiconductor device according to the second embodiment of the present invention.
Figure 15:
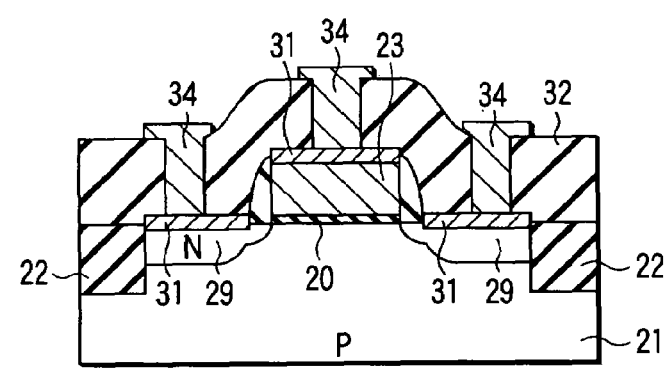
FIG. 15 is a sectional view of the semiconductor device in a manufacturing step following the manufacturing step of FIG. 14, for explaining the method of manufacturing the semiconductor device according to the second embodiment of the present invention.
Figure 16:
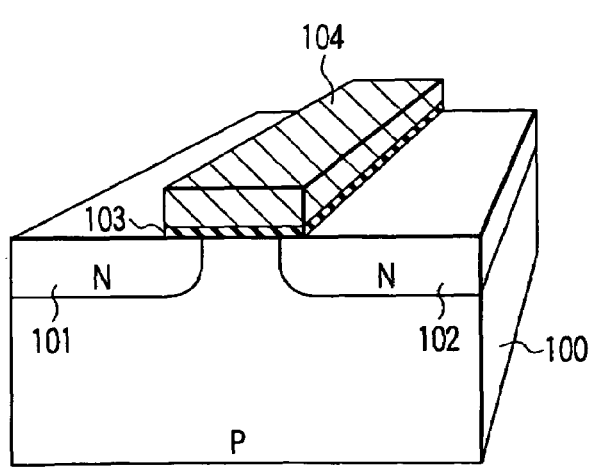
FIG. 16 is a schematic perspective view of an n-channel MOSFET.

An interlayer insulating film including the silicon dioxide film 32 such as BPSG is deposited on the entire surface of the silicon semiconductor substrate 21 by CVD method or the like (FIG. 13). Successively, the silicon dioxide film 32 is etched by using RIE method or the like to form contact holes 33 therein exposing those portions of the metal silicide film 31, which are on the source/drain regions 29 or the gate electrode 23 (FIG. 14). A metal film of aluminum is formed on the silicon dioxide film 32 and then patterned, to form wirings 34 connected electrically via the contact holes 33 to the metal silicide films 31 on the source/drain regions 29 and the gate electrode 32 (FIG. 15). Then, a passivation film or the like, not shown, is formed on the semiconductor substrate, and an MOS transistor is completed.

In the MOS transistor manufactured in this manner, having the gate insulating film formed in the process mentioned in the first embodiment, even after the heating process at 1000° C. or more (the heating process also included in the conventional method), the gate leakage current is three order of magnitude lower than that of the conventional MOS transistor employing a silicon dioxide film formed directly on the semiconductor substrate as the gate insulating film. Further, the channel mobility is about 85% or more of that of the conventional MOS transistor, and there is no practical problem, and both of the low power consumption and high performance of LSI are satisfied.

In the embodiments, increase of interface state due to introduction of nitrogen is suppressed, and generation of fixed charge in the insulating film is suppressed, so that a semiconductor device of high performance and low power consumption is realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
   forming a film containing metal elements and silicon elements on a semiconductor substrate;
   exposing the semiconductor substrate to an atmosphere containing an oxidant to form a silicon dioxide film at the interface between the semiconductor substrate and the film containing metal elements and silicon elements; and
   nitriding the film containing metal elements and silicon elements after forming the silicon dioxide film.

2. A method of manufacturing a semiconductor device, according to claim 1, wherein the metal elements includes at least one of Zr, Hf, Al and La.

3. A method of manufacturing a semiconductor device, according to claim 1, wherein the film containing metal elements and silicon elements is formed by using CVD.

4. A method of manufacturing a semiconductor device, according to claim 1, wherein the film containing metal elements and silicon elements contains oxygen or nitrogen.

5. A method of manufacturing a semiconductor device, according to claim 1, wherein the film containing metal elements and silicon elements contains oxygen and nitrogen.

6. A method of manufacturing a semiconductor device, according to claim 1, wherein the film containing metal elements and silicon elements is formed by using an alkoxide or an amide compound as a precursor.

7. A method of manufacturing a semiconductor device, according to claim 6, wherein the alkoxide is at least one of tetra ethoxy silane and hafnium tetra tertiary butoxide.

8. A method of manufacturing a semiconductor device, according to claim 6, wherein the amide compound is made of at least one of tetraxy diethyl amide hafnium and tetraxy dimethyl amide silicon.

9. A method of manufacturing a semiconductor device, according to claim 1, wherein the film containing metal elements and silicon elements is formed by using an alkoxide and an amide compound as a precursor.

10. A method of manufacturing a semiconductor device, according to claim 9, wherein the alkoxide is at least one of tetra ethoxy silane and hafnium tetra tertiary butoxide.

11. A method of manufacturing a semiconductor device, according to claim 9, wherein the amide compound is made of at least one of tetraxy diethyl amide hafnium and tetraxy dimethyl amide silicon.

12. A method of manufacturing a semiconductor device, according to claim 1, wherein the atmosphere containing an oxidant is an atmosphere of a partial pressure of an oxidant is 0.1 Torr or less.

13. A method of manufacturing a semiconductor device, according to claim 1, wherein the atmosphere containing an oxidant is one of an oxidation atmosphere containing an active oxidation species, a low temperature plasma oxidation atmosphere, a low pressure $O_2$ oxidation atmosphere, a low pressure $H_2O$ oxidation atmosphere, and a low pressure $N_2O$ oxidation atmosphere.

14. A method of manufacturing a semiconductor device, according to claim 13, wherein a low pressure $O_2$ oxidation atmosphere, a low pressure $H_2O$ oxidation atmosphere, and a low pressure $N_2O$ oxidation atmosphere is a reduced atmosphere at a temperature of 800° C. or less.

15. A method of manufacturing a semiconductor device, according to claim 1, wherein nitriding the film containing metal elements and silicon elements is carried out by using a nitrogen radical or nitrogen plasma.

16. A method of manufacturing a semiconductor device, according to claim 1, wherein nitriding the film containing metal elements and silicon elements is carried out by using an $NH_3$ nitridation method.

17. A method of manufacturing a semiconductor device, comprising:
   forming a film containing metal elements and silicon elements on a semiconductor substrate;
   exposing the semiconductor substrate to an atmosphere containing an oxidant to form a silicon dioxide film at the interface between the semiconductor substrate and the film containing metal elements and silicon elements;
   nitriding the film containing metal elements and silicon elements to form a gate insulating film comprising the silicon dioxide film and a nitrided film containing metal elements and silicon elements;
   forming a gate electrode on the gate insulating film; and
   forming source/drain regions in the surface region of the semiconductor substrate to sandwich a region covered by the gate electrode.

* * * * *